(12) United States Patent
Lee et al.

(10) Patent No.: US 12,251,785 B2
(45) Date of Patent: Mar. 18, 2025

(54) CHEMICAL MECHANICAL PLANARIZATION EQUIPMENT, WAFER TRANSFER METHOD, AND WAFER PLANARIZATION UNIT

(71) Applicant: HANGZHOU SIZONE ELECTRONIC TECHNOLOGY INC., Zhejiang (CN)

(72) Inventors: EdwardLiCang Lee, Zhejiang (CN); Jingran Gu, Zhejiang (CN)

(73) Assignee: HANGZHOU SIZONE ELECTRONIC TECHNOLOGY INC., Zhejiang (CN)

( * ) Notice: Subject to any disclaimer, the term of this patent is extended or adjusted under 35 U.S.C. 154(b) by 389 days.

(21) Appl. No.: 17/274,183

(22) PCT Filed: Aug. 20, 2019

(86) PCT No.: PCT/CN2019/101581
§ 371 (c)(1),
(2) Date: Mar. 7, 2021

(87) PCT Pub. No.: WO2020/048311
PCT Pub. Date: Mar. 12, 2020

(65) Prior Publication Data
US 2021/0260716 A1    Aug. 26, 2021

(30) Foreign Application Priority Data

Sep. 7, 2018  (CN) .......................... 201811043848.7
Dec. 3, 2018  (CN) .......................... 201811466539.0
Jun. 4, 2019  (CN) .......................... 201910481448.2

(51) Int. Cl.
B24B 29/02    (2006.01)
B24B 37/30    (2012.01)
(Continued)

(52) U.S. Cl.
CPC .............. *B24B 29/02* (2013.01); *B24B 37/30* (2013.01); *B24B 37/345* (2013.01); *B24B 41/06* (2013.01);
(Continued)

(58) Field of Classification Search
CPC . B24B 7/228; B24B 27/0023; B24B 27/0069; B24B 27/0076; B24B 29/02;
(Continued)

(56) References Cited

U.S. PATENT DOCUMENTS 5,738,574 A    4/1998  Tolles et al.
5,904,611 A *  5/1999  Takahashi ............. B24B 37/345
                                                    451/41

(Continued)

FOREIGN PATENT DOCUMENTS

CN    100334691    8/2007
CN    205122542    3/2016
(Continued)

OTHER PUBLICATIONS

Translation of JP-2011101913-A (Year: 2011).*
(Continued)

*Primary Examiner* — Tom Rodgers
*Assistant Examiner* — Steven Huang
(74) *Attorney, Agent, or Firm* — JCIP GLOBAL INC.

(57) ABSTRACT

A chemical-mechanical planarization equipment, comprising a polishing module, a cleaning module and a wafer transfer module, wherein the polishing module comprises two rows of polishing unit arrays, each row of polishing unit arrays comprises two or more sets of polishing units, polishing transfer stations corresponding to two rows of polishing unit arrays are longitudinally arranged and located in the row direction of the polishing unit arrays, and a working (Continued)

area of the wafer transfer module is located vertically above the longitudinally arranged polishing transfer stations.

7 Claims, 7 Drawing Sheets

(51) Int. Cl.
  *B24B 37/34* (2012.01)
  *B24B 41/06* (2012.01)
  *H01L 21/304* (2006.01)
  *H01L 21/306* (2006.01)

(52) U.S. Cl.
  CPC ...... *H01L 21/304* (2013.01); *H01L 21/30625* (2013.01)

(58) Field of Classification Search
  CPC ....... B24B 37/042; B24B 37/10; B24B 37/30; B24B 37/345; B24B 41/005; B24B 41/06; B24B 55/04; B24B 37/34; H01L 21/304; H01L 21/30625; H01L 21/677; H01L 21/6773; H01L 21/67703; H01L 21/67706; H01L 21/67712; H01L 21/67733; B23Q 7/00; B23Q 7/04; B23Q 7/16; B23Q 7/18
  USPC ....... 451/10, 11, 41, 54, 285, 287, 334–337, 451/451, 455
  See application file for complete search history.

(56) References Cited

U.S. PATENT DOCUMENTS

| | | | | |
|---|---|---|---|---|
| 5,947,802 | A * | 9/1999 | Zhang | B24B 37/04 451/334 |
| 8,795,032 | B2 | 8/2014 | Miyazaki et al. | |
| 2002/0071756 | A1* | 6/2002 | Gonzalez | H01L 21/68707 414/941 |
| 2004/0072499 | A1* | 4/2004 | Wakabayashi | H01L 21/67161 451/65 |
| 2005/0118938 | A1* | 6/2005 | Mizomoto | B24B 7/228 451/65 |
| 2005/0159082 | A1* | 7/2005 | Sakurai | B24B 37/042 451/11 |
| 2009/0305612 | A1* | 12/2009 | Miyazaki | H01L 21/67742 134/32 |
| 2015/0270151 | A1* | 9/2015 | Yokoyama | H01L 21/67751 414/222.03 |
| 2016/0008948 | A1* | 1/2016 | Aizawa | B24B 37/04 451/287 |
| 2017/0252894 | A1 | 9/2017 | Miyazaki et al. | |
| 2018/0001440 | A1 | 1/2018 | Aono et al. | |

FOREIGN PATENT DOCUMENTS

| | | | | |
|---|---|---|---|---|
| CN | 105870045 | | 8/2016 | |
| CN | 206105604 | | 4/2017 | |
| CN | 109015314 | | 12/2018 | |
| CN | 109262444 | | 1/2019 | |
| CN | 110026879 | | 7/2019 | |
| CN | 112207655 | A * | 1/2021 | ............. B24B 29/02 |
| JP | 2003163181 | A * | 6/2003 | ........... H01L 21/677 |
| JP | 2004106084 | | 4/2004 | |
| JP | 2011101913 | A * | 5/2011 | ........ B24B 27/0023 |
| JP | 2021077763 | A * | 5/2021 | ........... B24B 37/005 |
| KR | 20110121511 | | 11/2011 | |
| KR | 20180084572 | | 7/2018 | |
| TW | M540388 | U * | 4/2017 | |

OTHER PUBLICATIONS

Translation of CN 106449510 A (Year: 2017).*
Translation of JP2021077763A (Year: 2021).*
Translation of CN 112207655 A (Year: 2021).*
Translation of Tw M540388 U (Year: 2014).*
"Written Opinion and Search Report of Singapore Counterpart Application", issued on Apr. 22, 2022, p. 1-p. 11.
"International Search Report (Form PCT/ISA/210) of PCT/CN2019/101581," mailed on Nov. 15, 2019, with English translation thereof, pp. 1-8.
Office Action of Korean Counterpart Application, issued on Dec. 6, 2022, pp. 1-11.

* cited by examiner

CHEMICAL MECHANICAL PLANARIZATION EQUIPMENT, WAFER TRANSFER METHOD, AND WAFER PLANARIZATION UNIT

BACKGROUND

Technical Field

The invention relates to the technical field of semiconductor equipment, in particular to a chemical mechanical planarization equipment, a wafer transfer method, and a wafer planarization unit.

Description of Related Art

With the rapid development of semiconductor industry, the critical dimension of integrated circuits continues to be miniaturized, and the high planarization of semiconductor film surface has a significant impact on the high performance, low cost, and high yield of the device.

Chemical Mechanical Planarization (CMP) technology is a combination of chemical and mechanical actions. Its working principle is that the surface material of the workpiece chemically reacts with the oxidizer and catalyst in the polishing liquid to form a soft layer that is relatively easy to remove, and then the soft layer is removed under the mechanical action of the abrasive in the polishing liquid and the polishing pad, and the surface of the workpiece is exposed again, followed by chemical reactions. The surface of the workpiece is smoothed and polished through the combined alternating chemical and mechanical actions.

Currently, CMP technology has integrated technologies such as online measurement, online endpoint detection, cleaning, etc. As the product of integrated circuits toward miniaturization, multilayer, thinning, and planarization, CMP is also the technology necessary for the transition of wafers from 200 mm to 300 mm, or to larger diameters, and necessary for the improvement of productivity, the lowering of manufacturing costs, and the whole planarization of substrate.

A typical CMP equipment usually comprises a plurality of polishing units, and auxiliary devices for cleaning, wafer transportation and drying, etc. The polishing unit usually includes a polishing platen, a polishing pad, a polishing head, a polishing arm, a pad conditioner, a polishing slurry arm, etc. The polishing pad, polishing head, polishing arm, conditioner, and polishing slurry arm are arranged on the platen according to the processing position. It is found that in actual wafer processing, the spatial arrangement of the polishing units, and the modules such as cleaning module and wafer transfer module, has a great influence on the overall polishing throughput of the CMP equipment.

Generally, wafer transfer among the polishing unit and the outside, and among polishing units, is implemented by the polishing transfer station or a similar device. Regarding the spatial layout of transfer stations and polishing units, relatively mature models have already been available in the industry, and in a technical solution disclosed in the US patent document U.S. Pat. No. 5,738,574, for example, the polishing transfer station and three polishing units are arranged in a square format. During operation, a rotatable device (carousel) with four polishing heads distributed in a square, moves downwards to complete the loading and unloading of wafers with the polishing transfer station in turn. It is worth mentioning that, in the above device, each of the three polishing units is equipped with a cleaning device adjacent thereto, with one cleaning device located between the corresponding polishing unit and the polishing transfer station. Clearly, the disadvantage of such technical layout is the complicated technological process, since a transfer station needs to use a shared rotatable device to load and unload the three polishing units.

Another U.S. Pat. No. 8,795,032B2 discloses another technical layout, wherein four polishing units are arranged side by side, and wafer transfer is accomplished by the two linear transport mechanisms located in the loading and unloading area at the end of the planarization equipment and allocated along the arrangement direction of polishing units, while the other side of the linear transport mechanism is a cleaning area. Each of the aforementioned linear transport mechanisms renders services for two polishing units, and provides two transfer stations for each of the polishing units, and the polishing head of polishing units can load and unload wafers from one of the polishing transfer stations. This layout utilizing the linear arrangement of polishing units has the disadvantage that each polishing unit is equipped with two transfer stations, but the polishing unit only loads and unloads wafers directly from one of them during the polishing process, and the wafer transfer efficiency needs to be improved.

CMP equipment usually includes a semiconductor equipment front-end module (EFEM), a cleaning module, and a polishing module. EFEM mainly includes a wafer carrier for storing wafers, a transfer robot, and an air purification system. Cleaning module mainly includes a varying number of megasonic cleaning components, scrubber cleaning components, drying components, and devices for transferring wafers among components, etc. Polishing module includes a varying number of polishing units, each mainly comprising a polishing platen, a polishing head, a polishing liquid supply system, and a polishing pad dressing system.

A wet wafer transfer robot that transfers wet wafers is usually disposed between the cleaning module and the polishing module. Typically, the path of wafers in the CMP equipment is as follows: wafers to be polished in the wafer carrier are placed on the polishing transfer in/out station by the transfer robot in EFEM, and the wafers to be polished are transferred by the wet wafer transfer robot to the polishing module. After being processed by the polishing module, wafers are transferred to the cleaning module by the wet wafer transfer robot, and then placed back into the wafer carrier by the wafer transfer robot in EFEM.

In the general CPM process, the transfer of wafers among various areas and from the polishing transfer in/out station to the polishing transfer stations of polishing module should be completed by two robots: a wafer transfer robot and a wet wafer transfer robot. Therefore, the wafer transfer efficiency also needs to be improved.

With the popularization and promotion of mobile technology and smart technology, the demand for microchips in chip industry continues to grow, therefore the wafer foundries with limited and highly expensive factory space require higher and higher production capacity. CMP equipment is a key technology in the chip manufacturing process. Relying on the CMP equipment, chip manufacturing is expanded from planar to three-dimensional, and the size of chips is becoming smaller and smaller, therefore, CMP equipment has been a very critical process in the processing and production chain of wafers.

As an important indicator for the assessment of CMP equipment, the productivity of CMP equipment is very critical. Usually, existing CMP equipment structurally consists of a cross turret mechanism, a four-station device (three planarization rotation stations and a loading platform) and four polishing heads on the turret mechanism. When working, the wafer on the transfer station is first taken out by the polishing head, and the previously processed wafer is placed on the empty loading position by the rotating cross turret, and then the polishing head loaded with wafer is positioned at a corresponding station according to the working procedure. During operation, the polishing head covers the entire wafer by moving linearly back and forth in the radial direction along the cross turret. After processing is completed, the wafers are placed on the transfer station and taken away by the robot.

The disadvantages of the above-mentioned equipment are the relatively large mechanism in size and the complicated structure. Since the cross turret needs to rotate frequently in a large angle range, the data line of the sensor disposed on the cross turret may rotate with a large angle, easily affecting the measurement stability of the sensor. If one of the parts of the equipment needs to be repaired, it is required to shut down the whole machine, greatly reducing the utilization rate of the equipment and even resulting in poor process stability during wafer processing.

SUMMARY

The first objective of the invention is to, regarding the problem of low efficiency and complex structure of the wafer transfer mechanism in existing CMP equipment, provide a CMP equipment with an innovative array layout of polishing units and, based on the array layout, propose a wafer transfer module arranged above the polishing unit array, so that the wafer transfer units of wafer transfer module pass through the polishing unit without interference at any time.

The second objective of the invention is to provide a CMP equipment and a wafer transfer method for the full-range wafer transfer among the polishing in/out station, the polishing transfer station and the cleaning transfer station. That is, not only it integrates the wafer transfer robot and the wet wafer transfer robot, but also it handles the wafer transfer among the polishing transfer stations.

The third objective of the invention is to, regarding the above recited issues, provide a modularized wafer planarization unit(s), whose number can be defined according to the customer's process requirements. This unit is separated into two areas, one is located inside the unit, called the planarization unit, containing the polishing platen, polishing rotation device, polishing head, polishing swing arm, conditioner swing arm and polishing liquid spraying arm, and the other is the polishing transfer station for loading and unloading wafers.

In order to achieve the first objective, the invention provides a CMP equipment as a solution, which is composed of a polishing module, cleaning modules used for cleaning polished wafers, and a wafer transfer module. The polishing module includes two rows of polishing unit arrays, each containing two or more sets of polishing units; the polishing transfer stations corresponding to the two rows of polishing unit arrays are longitudinally arranged, in a row direction of the polishing unit arrays; the cleaning modules are arranged in two rows, corresponding to the two rows of polishing unit arrays; the working area of the wafer transfer module is located vertically above the polishing transfer stations that are longitudinally arranged, and performs wafer transfer among other loading and unloading area and the polishing transfer stations, and between the polishing transfer stations.

The other loading and unloading area is a cleaning transfer station where wafers entering and leaving the polishing module are temporarily stored.

Additionally, the above recited wafer transfer module includes one or multiple sets of wafer transfer units, each of the wafer transfer units comprise a guide device, a horizontal movement actuating device, a vertical movement mechanism, a wafer chuck, and a wafer clamp; the horizontal movement actuating device drives the vertical movement mechanism to slide along the guide device horizontally, and the vertical movement mechanism is connected with the wafer chuck, and controls the wafer chuck to work in two modes of a high position and a low position; the wafer clamp is installed on the wafer chuck, and performs opening and closing actions.

If there are many rows of polishing unit arrays, each of the above recited wafer transfer units is arranged as a cascade along a row direction of the two rows of polishing units, to perform wafer transfer among other loading and unloading areas, such as cleaning transfer station and the polishing transfer stations, and between the polishing transfer stations. The multiple sets of wafer transfer units can collaborate with each other to move around wafers in the entire polishing unit arrays.

Preferably, the above recited wafer chuck has a flip structure, and two sets of wafer clamp mechanisms are allocated on both sides of the wafer chuck.

The above recited polishing transfer station can be moved longitudinally in the row direction of the polishing unit arrays, so that each polishing transfer stations can be correspondent to more than one of the polishing units. For instance, in a layout of 2 rows×3 units, only 3 polishing transfer stations are needed to be applied to the 6 polishing units.

To prevent the leakage of liquid and water vapor in the polishing area, a polishing door that can be opened and closed is provided between the polishing unit and the polishing transfer stations.

Furthermore, the present invention provides a wafer transfer method using the above recited CMP equipment, including the following steps:

S1: In an initial state, the wafer chuck controlled by the vertical movement mechanism is at the high position, so that the wafer chuck can freely move horizontally;

S2: When the horizontal movement actuating device drives the vertical movement mechanism to move along the guide device to a location above the cleaning transfer station or the polishing transfer station, the vertical movement mechanism controls the wafer chuck to drop down to the low position, and the wafer clamp installed on the wafer chuck grabs a wafer;

S3: Thereafter, the vertical movement mechanism controls the wafer chuck to rise to the high position, and the horizontal movement actuating device drives the vertical movement mechanism to move along the guide device to the location above a next cleaning transfer station or the polishing transfer stations;

S4: The vertical movement mechanism controls the wafer chuck to drop down to the low position, and the wafer clamp on the wafer chuck releases the wafer;

S5: Repeat the above steps so that the wafer can be transferred among the cleaning transfer station and the polishing transfer stations.

Compared with the prior technology of CMP equipment, the present invention has the following technical advantages:

1. In the invention, the layout with polishing units arranged in two rows and wafer transfer units in the center helps to reduce the transfer range and improve the process efficiency of the CMP equipment by about 50%, and the modular structure allows for more flexible equipment layout;
2. Since the wafer transfer unit above a polishing transfer station can transfer wafers from one polishing transfer station to another, or take or place wafers from/to the polishing module, therefore the polishing transfer station can pass through the polishing unit without interference at any time when the polishing head is loading or unloading wafers on the polishing transfer station;
3. Similar to the above recited layout of the polishing unit and wafer transfer unit, using the cleaning robot, a wafer can be placed onto either of the cleaning modules arranged on the left and right, which results in improving the efficiency of the combined polishing and cleaning unit;
4. According to the requirement of production capacity, two or more sets of wafer transfer units can be equipped for two rows of multiple sets of polishing unit arrays, therefore the equipment has better scalability.

In order to achieve the second objective, the present invention provides a CMP equipment, wherein the wafer transfer module includes at least one set of wafer transfer robot; such wafer transfer robot includes a horizontal transmission mechanism, a vertical transmission mechanism connected to the horizontal transmission mechanism, and a wafer grabbing device connected to the vertical transmission mechanism; the vertical transmission mechanism drives the wafer grabbing device to move up-and-down vertically in a straight line; the horizontal transmission mechanism drives the vertical transmission mechanism to move horizontally in a straight line, which in turn drives the wafer grabbing device to move horizontally in a straight line; a polishing in/out station, a cleaning transfer station and the polishing transfer stations are arranged within a moving range in a direction of the straight line horizontal movement of the wafer grabbing device.

The CMP equipment includes two or more sets of wafer transfer robots arranged in parallel and being symmetrical.

In the CMP equipment, the wafer grabbing devices of the two or more sets of wafer transfer robots are located in areas with different heights to avoid collisions when moving simultaneously along a horizontal straight line.

The CMP equipment, wherein the polishing in/out station, the cleaning transfer stations and the polishing transfer stations are successively arranged in a straight line; the cleaning modules are located on both sides of the polishing transfer station and the cleaning transfer station; the polishing modules are located on both sides of the polishing transfer stations.

The CMP equipment, wherein the wafer transfer robot is, by hoisting, at a location above the polishing in/out station, the cleaning transfer station, and the polishing transfer station.

The invention also provides a method for wafer transfer using the above CMP equipment, which including the following steps:

S0: A wafer to be processed is first placed on the polishing in/out station;
S1: The horizontal transmission mechanism drives wafer grabbing device to move to a location above the polishing in/out station, and the wafer grabbing device moves down along the vertical transmission mechanism to a location of the polishing in/out station to grab the wafer;
S2: The wafer grabbing device carrying the wafer moves up to a certain height along the vertical transmission mechanism, and then the wafer grabbing device is, in the horizontal straight line direction, driven by the horizontal transmission mechanism to a location above a certain polishing transfer station;
S3: The wafer grabbing device carrying the wafer moves down to the position of a corresponding polishing transfer station along the vertical transmission mechanism, and releases the wafer, and the wafer transfer robot then can be arranged to transfer other wafers;
S4: After being polished on the polishing module, the wafer on the polishing transfer station is placed back on the polishing transfer station;
S5: The wafer grabbing device is driven by the horizontal transmission mechanism above the polishing transfer station loaded with polished wafers, and then lowered to the position of transfer station along the vertical transmission mechanism to grab the wafer;
S6: The wafer grabbing device carrying the wafer moves up to a certain height along the vertical transmission mechanism, and the wafer grabbing device is driven by the horizontal transmission mechanism to a location above the cleaning transfer station, and the wafer grabbing device moves down along the vertical transmission mechanism to a location of the cleaning transfer station to release the wafer;
S7: The wafer is transferred to the cleaning modules through the cleaning transfer station, so as to complete the cleaning process after polishing.

Compared with the prior art, the present invention has the following beneficial effects:

The wafer transfer robot provided by the invention directly transfers wafers from the polishing in/out station to the polishing transfer station with reduced number of transfers, shorter wafer transfer time, higher transfer efficiency and lower probability of damage to wafers due to transfer.

The CMP equipment provided by the invention can be symmetrically equipped with two sets of wafer transfer robots that work independently from each other. One or two sets of wafer transfer robots can be used according to the polishing needs, and the usage amount of wafer transfer robot can be selected according to the polishing workload, so as to make the configuration and use of the wafer transfer robots more flexible and to improve production capacity and efficiency of the entire machine.

In order to achieve the third objective, the technical solution adopted by the invention is a wafer planarization unit, comprising a polishing platform frame and a polishing platform located above the polishing platform frame, a platen disposed on the polishing platform, a polishing swing arm which drives a polishing head to swing on the platen, a polishing liquid spray arm, a conditioner swing arm, a wafer transfer station frame, and a wafer transfer station above the wafer transfer station frame. Among the above-mentioned components, only the wafer transfer station frame and the wafer transfer station are located outside a cover of the planarization unit, and the remaining components are all located inside the cover. A movable door is provided on the cover of the planarization unit, and the polishing swing arm drives the polishing head to pass through the movable door to a position above the wafer transfer station for wafer loading and unloading.

The movable door is closed during wafer polishing and is opened during wafer loading and unloading. After the polishing operation is completed, the internal and external gas flow is cut off by opening and closing the movable door.

The movable door is driven by a motor or an air cylinder.

As one of the main technical features of the present invention, the driving mechanism of the polishing swing arm is, as a whole, located above or below the polishing platform.

When the driving mechanism of polishing swing arm is, as a whole, located above the polishing platform, the driving mechanism comprises a motor, a decelerating mechanism, and a decelerating mechanism flange. A motor stator is connected to a cover of the decelerating mechanism, and the cover of the decelerating mechanism is connected to the polishing swing arm through the decelerating mechanism flange.

Preferably, the motor stator is connected to the cover of the decelerating mechanism through its own flange and screws.

When the driving mechanism of polishing swing arm is, as a whole, located below the polishing platform, the driving mechanism comprises a motor, a decelerating mechanism, a decelerating mechanism flange, a motor cover and a decelerating mechanism cover. The motor shaft is transmitted to the decelerating mechanism, and the decelerating mechanism is installed on a lower end surface of a transmission shaft cover through the decelerating mechanism flange.

An output shaft of decelerating mechanism is transmitted to a transmission shaft through a coupler, and then a torque is transmitted to the polishing swing arm through a swing arm gland.

Compared with the polishing structure of cross turret mechanism, the advantages of the present invention include:
1. The independent functional structure and processing area contained in the unit guarantee the stability of the process, and because of the modular design adopted by the unit, the number of CMP groups can be freely defined by customers according to their needs to meet different processing requirements.
2. When the internal mechanism is working, the external wafer loading mechanism can be operated independently, and the problem of processing efficiency affected by production suspension due to wafer loading is properly addressed. The existence of a swing arm not only satisfies the original requirements of polishing and loading and unloading wafers, but also simplifies the original complex structure for processing and loading wafers with the cross turret and linear motion.
3. The wafer loading and unloading device is separated from the internal processing area and an automatic sliding door protection isolation is provided in the middle to prevent secondary contamination to the processed wafers to be cleaned by the liquid in the processing area.
4. Due to the small footprint of the optimized structure, the output rate per square meter of the purification workshop is greatly increased. If, during group operation, one of the unit modules fails and is being maintained, other units in the CMP group do not need to stop operation.
5. The cables of related electrical components on the swing arm have the torsion angle less than 180 degrees, half of the previous structural torsion angle, helps to reduce the accident rate of cables due to torsional fatigue.

DESCRIPTION OF THE EMBODIMENTS

Figure 1:
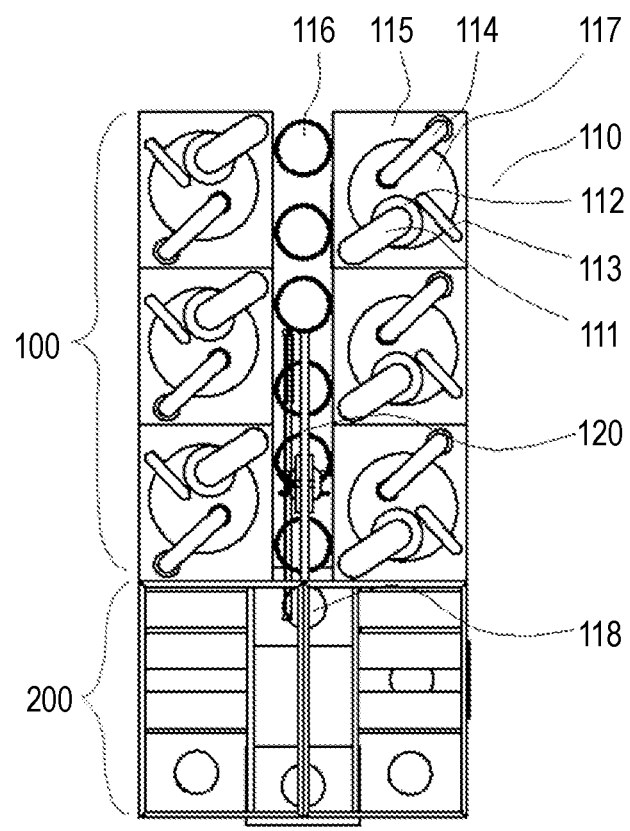
FIG. 1 is a top view of the CMP equipment (2×3 array) of the invention.

The present invention will be further described below through specific embodiments with reference to the accompanying drawings. These embodiments are only used to illustrate the present invention other than to limit its protection scope.

The CMP equipment according to the present invention comprises a polishing module constituted by a plurality of polishing units and a plurality of cleaning modules. Each of the polishing units include a platen, a polishing disc, a polishing head, a polishing arm, a conditioner, a polishing liquid arm, etc. A plurality of polishing transfer stations is provided on one side of the plurality of polishing units. The polishing disc, polishing head, polishing arm, conditioner, and polishing liquid arm are arranged on the platen according to the processing position. The polishing arm can move between the polishing pad and the polishing transfer station, along with the polishing head. The conditioner polishes the polishing disc with a certain pressure. The polishing liquid arm provides chemical liquid required for polishing. When wafers need to be loaded or unloaded, the polishing door of the polishing unit is opened, and the polishing arm, along with the polishing head, rotates to the position of polishing transfer station. After loading and unloading the wafer, the polishing arm, along with the polishing head, rotates to the position of polishing pad for polishing. Then the polishing door is closed to prevent the leakage of liquid and water vapor in the polishing area. During the polishing process, the polishing liquid arm discharges polishing liquid, and the conditioner trims the polishing disc. The polishing pad rotates at a certain speed and the polishing head concurrently spins on its axis at a certain speed.

The polishing unit array is connected with cleaning modules. The cleaning modules are arranged in two or more rows to form a combined polishing and cleaning unit. A cleaning transfer station is installed at the junction of the polishing unit array and the cleaning module, where wafers entering and leaving the polishing module are temporarily stored.

A robot is installed in the middle of the cleaning module to transfer wafers between the polishing unit and the cleaning module. When wafers are transferred, they pass through the cleaning transfer station.

In addition, the CMP equipment of the invention generally also integrates an equipment front-end unit module (EFEM). The cleaning unit generally relates to megasonic cleaning, roller brushing, and wafer drying, etc.

In the invention, the polishing module is a polishing unit array composed of multiple sets of polishing units in two rows, and all polishing transfer stations for the multiple sets of polishing units in two rows are arranged longitudinally, in a row direction of the two rows of polishing units, and the polishing unit array may also be expanded from multiple sets in two rows according to actual needs. In order to introduce the principle of the invention and to facilitate the implementation of the invention by those skilled in the art, the following embodiment descriptions are all based on the layout of 3 sets and 2 rows.

Figure 2:
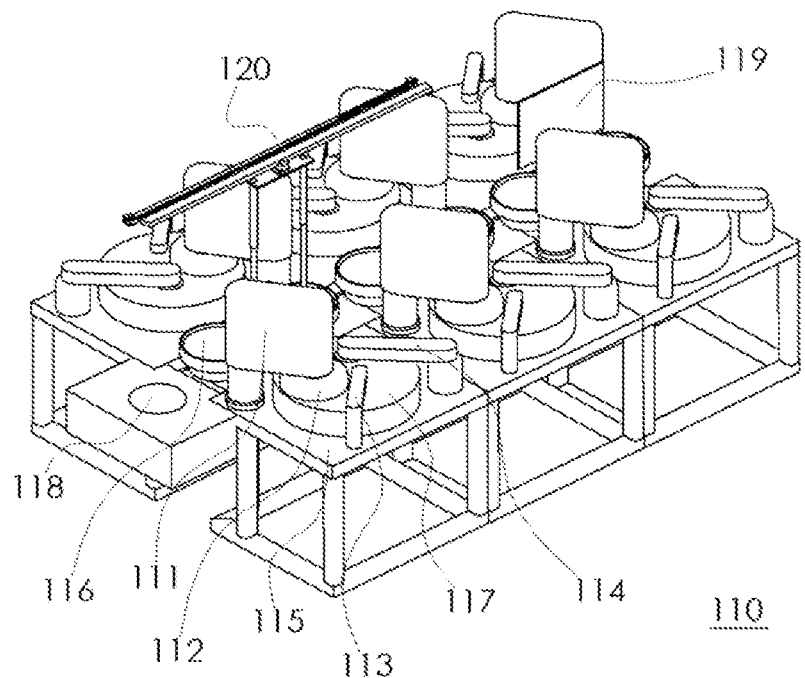
FIG. 2 is a three-dimensional effect diagram of the CMP equipment shown in FIG. 1.

FIGS. 1 and 2 respectively shows a top view and a three-dimensional view of a CMP equipment (2×3 array), wherein the CMP equipment includes a polishing unit array 100, a cleaning module assembly 200, and a wafer transfer unit 120. The polishing unit array 100 is composed of 2 lines and 3 rows of polishing units 110.

Figure 3:
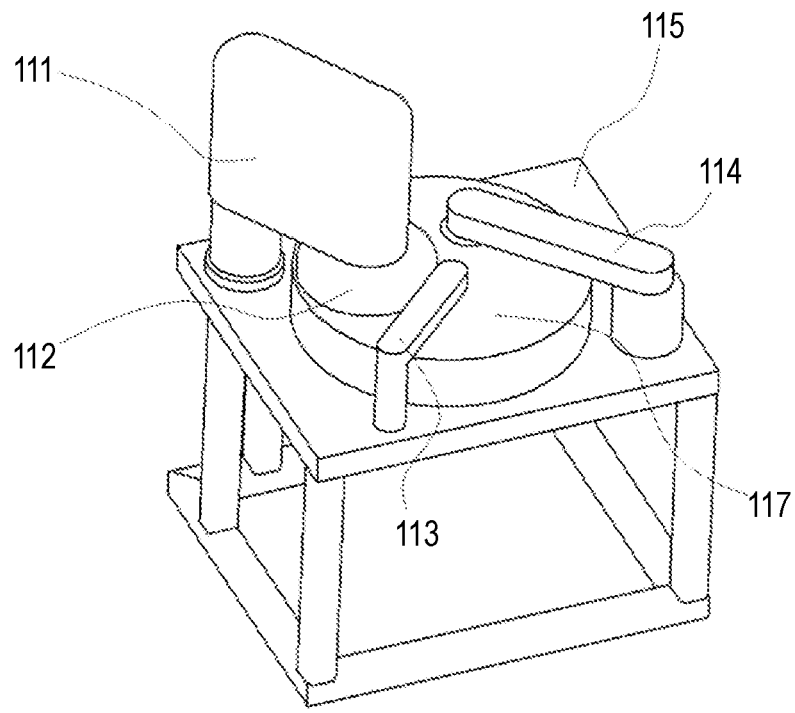
FIG. 3 is a schematic structural diagram of a polishing unit.

Each set of polishing units 110 includes, as shown in FIG. 3, a platen 115, a polishing disc 117, a polishing head 112, a polishing arm 111, a conditioner 114, a polishing liquid arm 113, a polishing door 119, etc.

A polishing door 119 is provided between the polishing unit 110 and the polishing transfer station 116, and when wafers need to be loaded or unloaded, the polishing door 119 of polishing unit 110 is opened, and the polishing arm 111, along with the polishing head 112, rotates to the position of the polishing transfer station 116. After loading and unloading the wafer, the polishing arm 111, along with the polishing head 112, rotates to the position of polishing pad 117 for polishing. Then the polishing door 119 is closed to prevent the leakage of liquid and water vapor in the polishing area. Wafers requiring chemical mechanical polishing enter the polishing unit array 100 through the cleaning transfer station 118 or other areas that function as temporary wafer loading and unloading areas, and the wafers that had been subjected to chemical mechanical polishing leave the polishing unit array 100 through the cleaning transfer station 118. Wafers are transferred by the wafer transfer unit 120 between the cleaning transfer station 118 and the polishing transfer station 116, and between each of the polishing transfer stations 116.

As shown in FIG. 3, the polishing pad 117, polishing head 112, polishing arm 111, conditioner 114, and polishing liquid arm 113 are disposed on the platen 115. The polishing pad 117 is connected to the platen 115 through a bearing system and can continuously rotate. The polishing arm 111, together with the polishing head 112, moves between the polishing pad 117 and the polishing transfer station 116. During the polishing process, the polishing arm 111, together with the polishing head 112, slightly swings within the range of polishing pad 117. In the process, the conditioner 114 reciprocates within the radius of polishing disc 117, and implements online trimming of the polishing disc 117 by the revolving wheel on the head of conditioner 114. Polishing liquid arm 113 supplies polishing liquid on the polishing pad 117 during polishing. After wafer polishing is completed, the polishing liquid arm 113, along with the polishing head 112, rotates to the position of the polishing transfer station 116 to unload the wafer, and then reload another wafer for the next polishing cycle.

Figure 4:
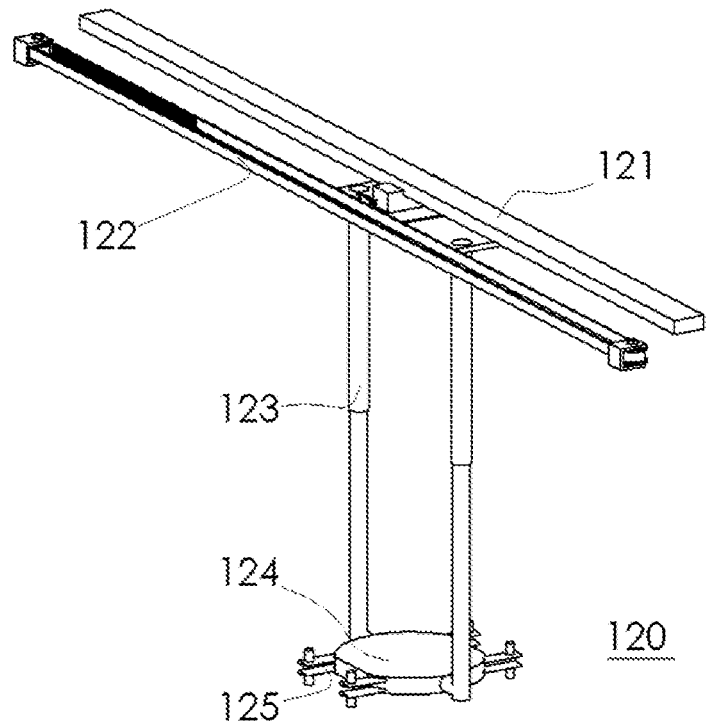
FIG. 4 is a schematic diagram of the structure of wafer transfer unit of the invention.

FIG. 4 is a schematic diagram of the wafer transfer unit 120 as the core component of wafer transfer module, including a guide device 121, a horizontal movement actuating device 122, a vertical movement mechanism 123, a wafer chuck 124, and a wafer clamp 125, etc. This part is the working part of wafer transfer module, which is connected to the CMP equipment through the connection part (not shown in the figure) of the wafer transfer module.

In an initial state, the vertical movement mechanism 123 controls the wafer chuck 124 to be in a high position, so that the wafer chuck 124 moves freely along the horizontal direction. When the horizontal movement actuating device 122 drives the vertical movement mechanism 123 to move above the cleaning transfer station 118 or the polishing transfer station 116 along the guide device 121, the vertical movement mechanism 123 controls the wafer chuck 124 to drop to a low position, and the wafer clamp 125 that can be opened and closed are installed on the wafer chuck. After a wafer is grabbed and released successively at the low position by the wafer clamp 125 and the wafer chuck 124, the vertical movement mechanism 123 controls the wafer chuck 124 to rise to a high position, and the horizontal movement actuating device 122 drives the vertical movement mechanism 123 to run above the next cleaning transfer station 118 or the polishing transfer station 116 along the guide device. The vertical movement mechanism 123 controls the wafer chuck 124 to drop to a low position, and the wafer clamp 125 installed on the wafer chuck 124 grabs the wafer. Such a reciprocating movement allows wafers to be transferred between the cleaning transfer station 118 and the polishing transfer station 116.

In order to improve the wafer transfer efficiency, as shown in FIG. 4, the wafer chuck 124 in the wafer transfer unit 120 is designed as a flip structure, and two sets of wafer clamp mechanisms 125 are allocated on both sides of the wafer chuck 124. At this time, the instance can effectively reduce the transferring route of the wafer transfer unit 120 and increase the transfer capacity of wafer transfer unit 120. Since the wafer transfer unit above transfer station can transfer wafers from one transfer station to another, or take wafers in or out from the polishing module. The wafer transfer unit arranged above the polishing transfer station can pass through the polishing unit undisturbed at any time when the polishing head is loading or unloading wafers on the polishing transfer station, which constitutes one of the main advantages of the present invention.

As shown in FIG. 1, the chemically and mechanically polished wafer is placed on the cleaning transfer station 118 by the wafer transfer unit 120, and the robot of the cleaning module 200 transfers the wafer from cleaning transfer station 118 to the cleaning module 200 for cleaning and drying after polishing. Two cleaning modules 200 are allocated on the left and right respectively, and the cleaning robot can choose to put wafers in any one of the cleaning modules 200 as needed.

As another embodiment of the present invention, the wafer transfer unit 120 can be designed into two or more sets to be arranged as a cascade along a row direction of the two rows of polishing units, so as to meet the capacity requirements of the two rows of multi-sets of the polishing unit array 100.

Figure 5:
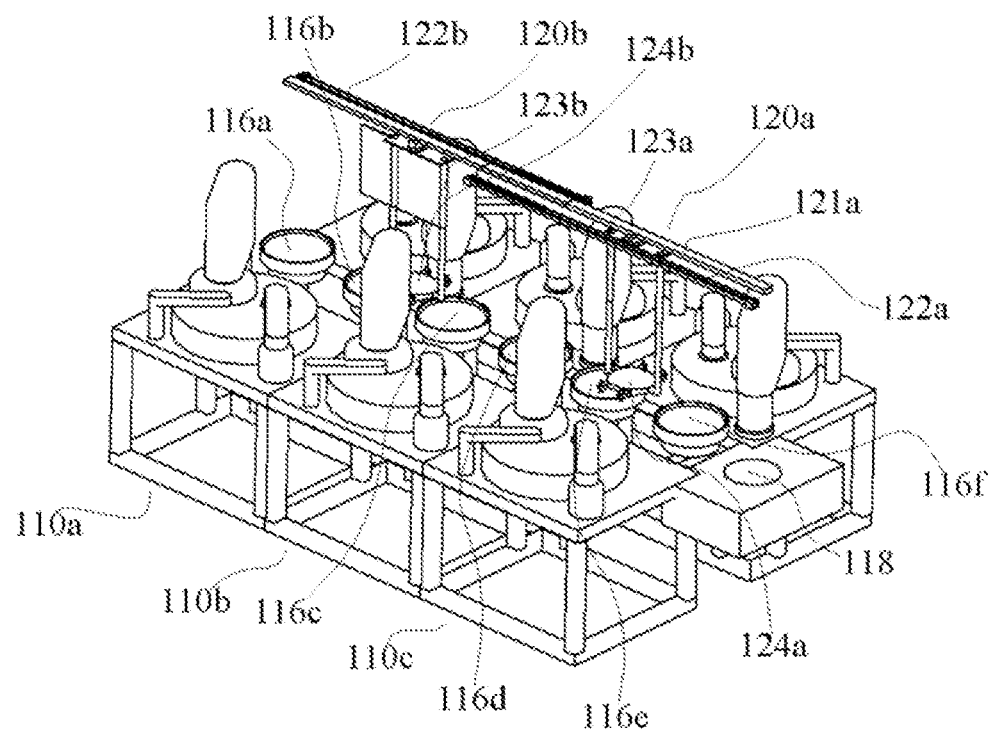
FIG. 5 is a three-dimensional effect diagram of an embodiment with dual wafer transfer units.

As shown in FIG. 5, the wafer transfer is realized by the cooperation of the wafer transfer unit 120a and the wafer transfer unit 120b. The wafer transfer unit 120a and the wafer transfer unit 120*b* can share a guide device 121*a*, and the wafer transfer unit 120*a* also includes a horizontal movement drive device 122*a*, a vertical movement mechanism 123*a*, a wafer chuck 124*a*, and a wafer clamp set on the wafer chuck 124*a*; the wafer transfer unit 120*b* also includes a horizontal movement drive device 122*b*, a vertical movement mechanism 123*b*, wafer chuck 124*b* and wafer clamp provided on wafer chuck 124*b*. The horizontal movement driving device 122*a* and the horizontal movement driving device 122*b* are arranged on both sides of the guide device 121*a*, and only the middle area of the guide device 121*a* has a movable overlap. The transfer unit 120*a* is responsible for the transfer of wafers between the cleaning transfer station 118, the polishing transfer station 116*f*, the polishing transfer station 116*e*, and the polishing transfer station 116*d*. The transfer unit 120*b* is responsible for the wafer transfer between the polishing transfer station 116*d*, the polishing transfer station 116*c*, and the polishing transfer station, the polishing transfer station 116*b* and the polishing transfer station 116*a*. The transfer unit 120*a* and the transfer unit 120*b* can reach the position of the polishing transfer station 116*d* at different times, so as to realize the flow of wafers in the entire polishing unit array 100.

Figure 6:
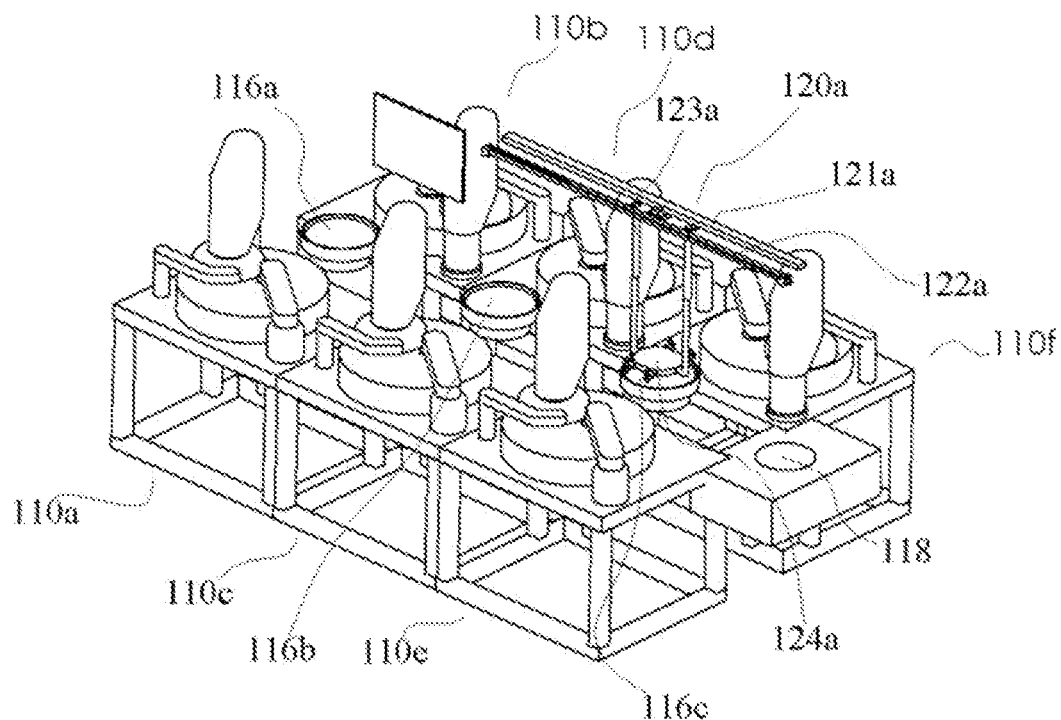
FIG. 6 is a three-dimensional effect diagram of an embodiment with a movable polishing transfer station.

As another embodiment, as shown in FIG. 6, a (2×3 array) chemical mechanical planarization equipment is provided with three movable polishing transfer stations, namely polishing transfer station 116*a*, polishing transfer station 116*b*, and polishing transfer station 116*c*. The polishing transfer station 116*a* is responsible for the polishing unit 110*a* and the polishing unit 110*b*; the polishing transfer station 116*b* is responsible for the polishing unit 110*c* and the polishing unit 110*d*; the polishing transfer station 116*c* is responsible for the polishing unit 110*e* and the polishing unit 110*f*. The chemical mechanical planarization equipment uses a wafer transfer unit 120*a* to transfer wafers. The wafer transfer unit 120*a* includes a guide device 121*a*, a horizontal motion drive device 122*a*, a vertical movement mechanism 123*a*, a wafer chuck 124*a*, and a wafer clamp disposed on the wafer chuck 124*a*.

The last two embodiments described above collectively exemplify the flexibility of the configuration of the wafer transfer unit of the present invention and the flexibility of pairing the wafer transfer unit with the polishing transfer station to be served, which are one of the significant advantages of the present invention.

Figure 7:
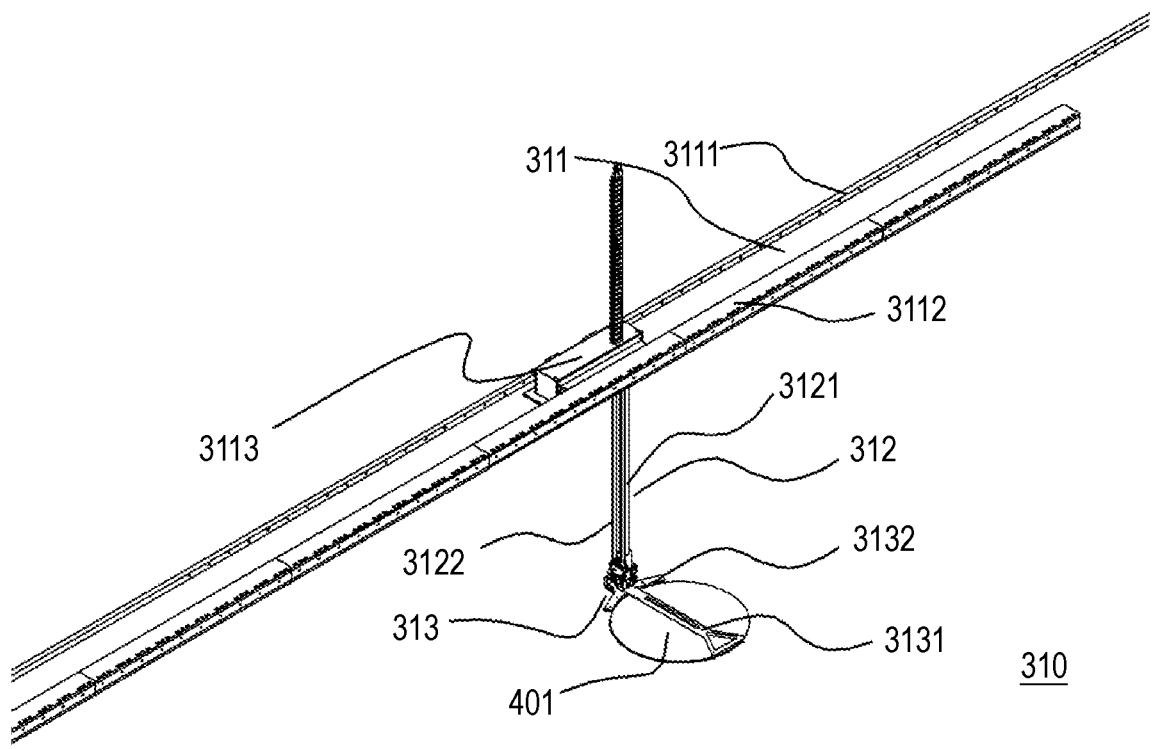
FIG. 7 is a schematic structural diagram of an embodiment of the wafer transfer robot of the invention.
Figure 8:
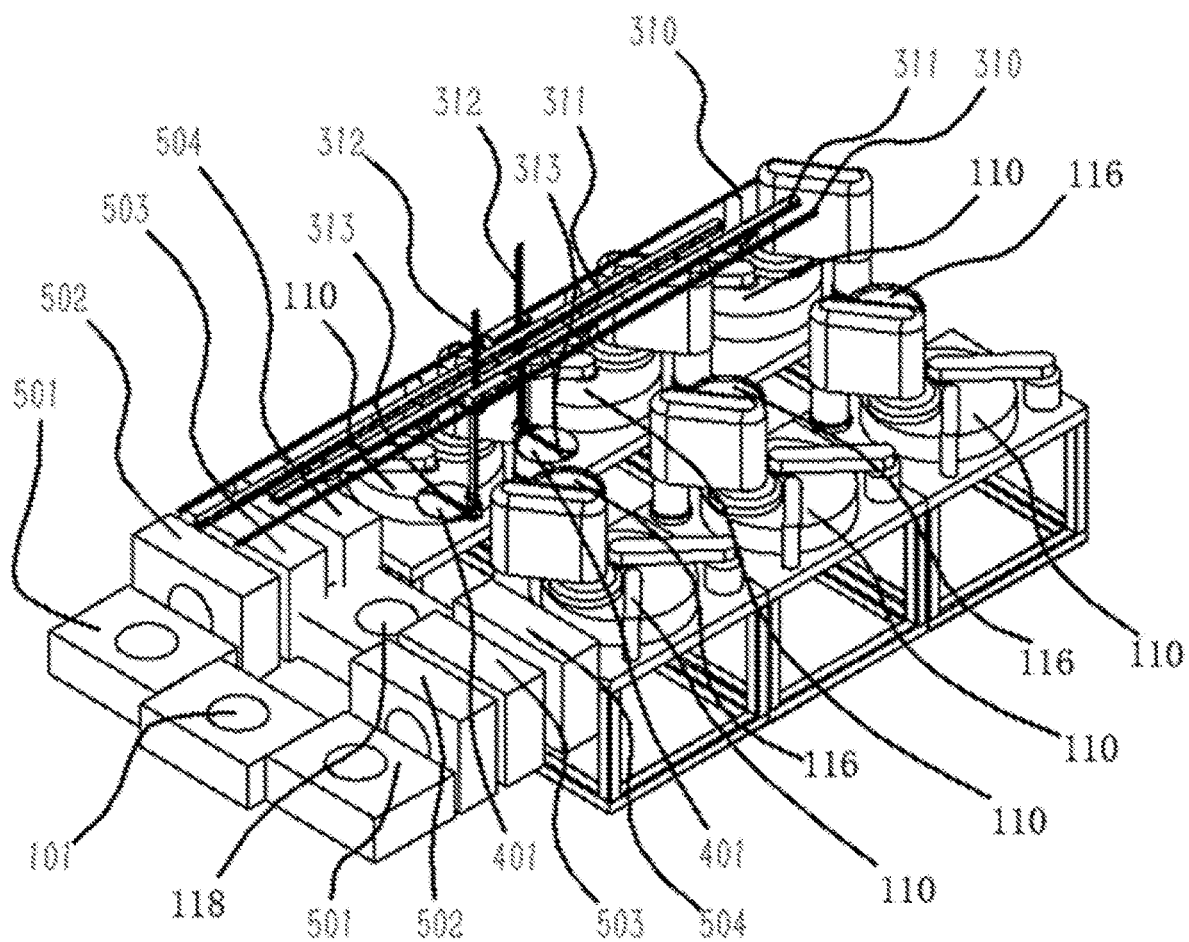
FIG. 8 is a schematic structural diagram of an embodiment of the CMP equipment of the invention.

In the invention the layout with polishing units arranged in two or more rows and the wafer transfer units in the center helps to reduce the transfer stroke and significantly improve the processing efficiency of the CMP equipment, and the modular design allows for more flexible equipment layout and higher adaptability;

As shown in FIGS. 7 and 8, the present invention provides a CMP equipment, wherein the wafer transfer module includes at least one set of wafer transfer robot 310; the wafer transfer robot 310 includes a horizontal transmission mechanism 311, a vertical transmission mechanism 312 connected to the horizontal transmission mechanism 311, and a wafer grabbing device 313 connected to the vertical transmission mechanism 312; the vertical transmission mechanism 312 drives the wafer grabbing device 313 to move up-and-down vertically in a straight line; the horizontal transmission mechanism 311 drives the vertical transmission mechanism 312 to move horizontally in a straight line, which in turn drives the wafer grabbing device 313 to move horizontally in a straight line; a polishing in/out station 101, a cleaning transfer station 118 and a polishing transfer station 116 are arranged within the moving range in a direction of the straight line horizontal movement of the wafer grabbing device 313 of the wafer transfer robot 310. The wafer grabbing device 313 of wafer transfer robot 310 can reach each positions of the polishing in/out station 101, the cleaning transfer station 118, and the polishing transfer station 116 arranged in the straight line. The wafer grabbing device 313 of wafer transfer robot 310 can reach each positions of the polishing in/out station 101, the cleaning transfer station 118, and the polishing transfer station 116 arranged in the straight line.

The above arrangement allows for the transfer of wafers 401 between the polishing in/out station 101, the polishing transfer station 116 and the cleaning transfer station 118, as well as between the polishing transfer stations 116 of the polishing module, thus the transfer robot and the wet wafer transfer robot are integrated, and the transfer of wafers 401 between each of the polishing transfer stations 116 is further accomplished. The wafer transfer robot directly transfers wafers 401 from the polishing in/out station 101 to the polishing transfer station 116 with reduced number of transfers of wafers 401, shorter wafer 401 transfer time, higher transfer efficiency and lower probability of damage to wafers 401 due to transfer.

On the basis of the foregoing embodiment, the polishing in/out station 101, cleaning transfer station 118, and polishing transfer station 116 are arranged in sequence along a straight line. Obviously, they may also be specifically arranged according to actual production requirements to improve transmission efficiency. As an embodiment of the specific layout of the CMP equipment, at least one cleaning module is provided on both sides of the polishing in/out station 101 and the cleaning transfer station 118 respectively. In the embodiment shown in FIG. 8, for example, the cleaning modules on both sides of the cleaning transfer station 118 and the polishing in/out station 101 are respectively designed as a combination of a first cleaning unit 504, a second cleaning unit 503, a third cleaning unit 502, and a drying unit 501. Polishing modules are arranged on both sides of the polishing transfer station 116, and the polishing modules are polishing units 110 arranged in a 2×3 array; an appropriate number of the polishing transfer stations 116 can be selected according to the production demand. In order to obtain a simpler and more convenient arrangement, the wafer transfer robot 310 may be installed above the polishing in/out station 101, the cleaning transfer station 118, and the polishing transfer station 116 by hoisting or other similar methods.

In order to improve the production capacity and production efficiency of the entire machine, the equipment may include two sets of wafer transfer robots 310 arranged in parallel and being symmetrical in order to transfer, and pick and place wafers 401 concurrently. The two sets of wafer transfer robots 310 can work independently without affecting each other. During the horizontal linear movement, the wafer grabbing device 313 can be set to locate in two regions of a high position and a low position. When located at a low position, the wafer grabbing device should be higher than the possible obstacles like the polishing head in the polishing unit 110, so as to avoid collision. The wafer grabbing devices 313 of the two sets of wafer transfer robots 310, which are moving concurrently along a horizontal straight line, are respectively located in the areas with different heights to avoid collisions, and either of them can be located in the high or the low regions, depending on actual needs. In addition, in order to prevent the wafer grabbing device 313 from colliding, the distance between the vertical transmission mechanisms 312 of the two sets of wafer transfer robots in working state 310 is greater than the diameter of the wafer 401.

The wafer transfer robot 310 in the present invention grabs and places wafers 401 through the wafer grabbing device 313 and at various positions, transfers wafers 401 in the horizontal linear direction assisted by the horizontal transmission mechanism 311 and the vertical transmission mechanism 312. The horizontal transmission mechanism 311 and the vertical transmission mechanism 312 with specifically designed dimensions allow to change the rise and fall as well as the range of horizontal linear movement of the wafer grabbing device 313 according to actual conditions.

Generally, the horizontal transmission mechanism 311 and the vertical transmission mechanism 312 in the invention includes a horizontal/vertical guide device/mechanism plus a horizontal/vertical driving device. The horizontal/vertical guide device may be a linear rolling guide, a linear sliding guide, a linear rolling bearing, etc.; the horizontal/vertical driving device may be a linear motor, a ball screw, a synchronous toothed belt, a steel belt, etc. The innovation of the present invention is that the traditional wafer 401 transfer method is improved by the structure and positional relationship of the wafer transfer robot 310. The specific structures of the horizontal transmission mechanism 311 and the vertical transmission mechanism 312 can be realized by using the existing technology, and it is only required that the wafer grabbing device 313 is capable of making horizontal linear movement and vertical linear movement up and down. Specifically, a combination of specific embodiments of the guiding mechanism and the driving device can achieve the beneficial technical effects achieved by the invention.

In a more specific embodiment, the horizontal transmission mechanism 311 includes a horizontal guide device 3111, a horizontal drive device 3112, and a horizontal movement platform 3113; wherein the horizontal drive device 3112 drives the horizontal movement platform 3113 to make horizontal linear movement along the horizontal guide device 3111. The vertical transmission mechanism 312 includes a vertical driving device 3122 and a vertical guide device 3121 connected to the horizontal movement platform 3113; the vertical driving device 3122 drives the wafer grabbing device 313 to move up-and-down vertically in a straight line along the vertical guide device 3121. The wafer grabbing device 313 includes a clamp 3131 and a pushing clamp 3132 connected to the vertical drive device 3122; the pushing clamp 3132 drives the clamp 3131 to move horizontally, and take and release the wafer 401 together with the clamp 3131.

The innovation of the CMP equipment provided by the invention is to use the wafer transfer robot 310 provided by the invention, and a polishing in/out station 101, a cleaning transfer station 118 and a polishing transfer station 116 are allocated in the range of movement of the wafer grabbing device 313 in the direction of horizontal linear motion. The transfer robot and the wet wafer transfer robot are integrated and the wafers 401 are also transferred between the polishing transfer stations 116. One or two sets of wafer transfer robots can be used according to the polishing needs, and the usage amount of wafer transfer robot can be selected according to the polishing workload, so as to make the configuration and use of wafer transfer robot more flexible and to improve production capacity and efficiency of entire machine.

The invention also provides a method for specifically performing wafer transfer during the actual processing of the wafers 401 using the above-mentioned CMP equipment, specifically including the following steps:

S0: A wafer 401 to be processed is first placed on the polishing in/out station 101;

S1: The horizontal transmission mechanism 311 drives wafer grabbing device 313 to move to a location above the polishing in/out station 101, and the wafer grabbing device 313 descends to a location of the polishing in/out station 101 along the vertical transmission mechanism 312 to grab the wafer 401;

S2: The wafer grabbing device 313 carries the wafer 401 up to a certain height along the vertical transmission mechanism 312, and then the wafer is, in the horizontal straight line direction, driven by the horizontal transmission mechanism 311 above a certain polishing transfer station 116;

S3: The wafer grabbing device 313 carries the wafer 401 down to the position of corresponding transfer station 116 along the vertical transmission mechanism 312, and releases the wafer 401, and the wafer transfer robot 310 then can be used for the transfer other wafers 401;

S4: The wafer 401 on the polishing transfer station 116, after being polished on the polishing module 110, is placed back on the polishing transfer station 116;

S5: The wafer grabbing device 313 is driven by the horizontal transmission mechanism 311 above the polishing transfer station 116 loaded with polished wafers, and then lowered to the position of the polishing transfer station 116 along the vertical transmission mechanism 312 to grab the wafer 401;

S6: The wafer grabbing device 313 carrying the wafers 401 move up to a certain height along the vertical transmission mechanism 312, and is then driven by the horizontal transmission mechanism 311 to a location above the cleaning transfer station 118, and the wafer grabbing device 313 descends along the vertical transmission mechanism 312 to a location of the cleaning transfer station 118 to release the wafer 401;

S7: The wafer 401 is transferred to the cleaning module 118 through the cleaning transfer station 118, so as to complete the cleaning process after polishing respectively through a first cleaning unit 504, a second cleaning unit 503, a third cleaning unit 502 and a drying unit 501.

After step S5, the wafer grabbing device 313 carrying the wafers 401 move up to a certain height along the vertical transmission mechanism 312, and is driven by the horizontal transmission mechanism 311 to a location above the polishing transfer station 116, and the wafer 401 is released in the same way, and polishing is performed;

In addition, the method and steps of using the CMP equipment including multiple sets of wafer transfer robots 310 are the same as the above.

In conclusion, the wafer transfer robot provided by the invention directly transfers wafers from the polishing in/out station to the polishing transfer station with reduced number of transfers, shorter wafer transfer time, higher transfer efficiency and lower probability of damage to wafers due to transfer.

The CMP equipment provided by the invention can be symmetrically equipped with two sets of wafer transfer robots that work independently from each other. One or two sets of wafer transfer robots can be used according to the polishing needs, and the usage amount of wafer transfer robot can be selected according to the polishing workload, so as to make the configuration and use of wafer transfer robot more flexible and to improve production capacity and efficiency of entire machine.

Figure 9:
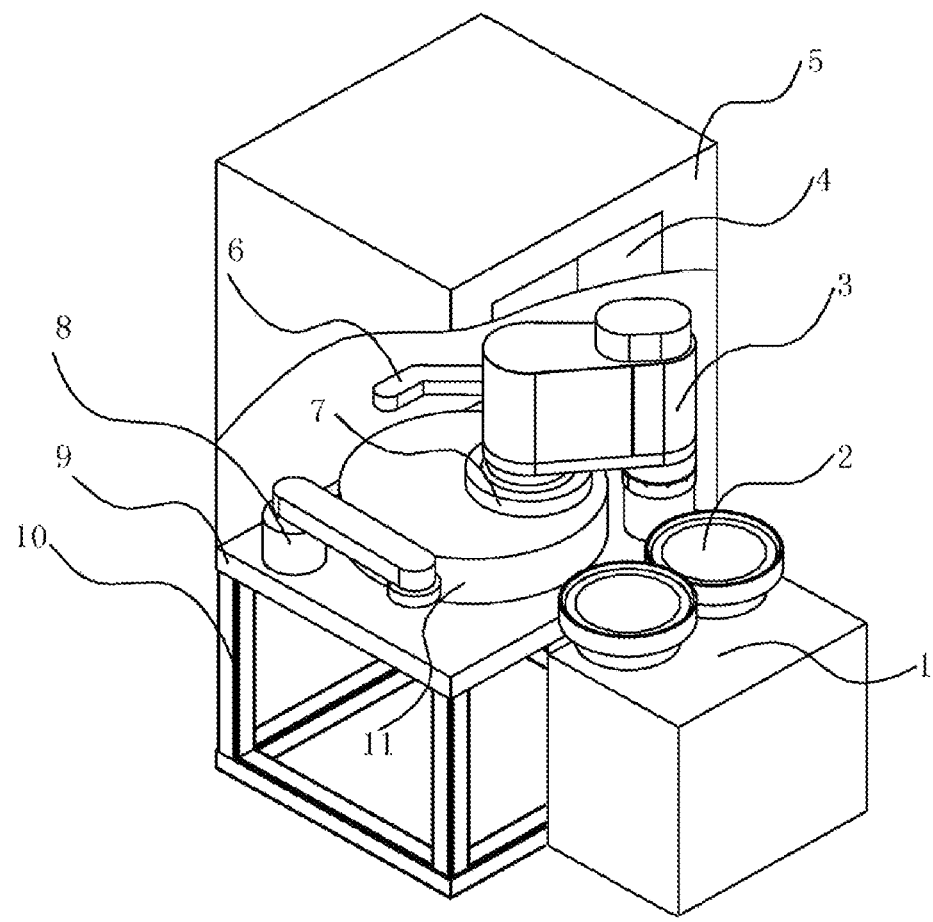
FIG. 9 is an axial view of a related equipment of the invention.

The axial schematic diagram of wafer planarization unit of the invention is shown in FIG. 9, including a wafer transfer station frame 1, a wafer transfer station 2, a polishing swing arm 3, a movable door 4, a planarization unit cover 5, a polishing liquid spray arm 6, a polishing head 7, a conditioner swing arm 8, a polishing platform 9, and a polishing platform frame 10. During polishing, the polishing swing arm 3, along with the polishing head 7, jointly completes a polishing operation together with the polishing liquid spray arm 6 and the conditioner swing arm 8. After the movable door 4 is opened, the polishing swing arm 3 will, along with the polishing head 7 and the loaded wafer, swing above the wafer transfer station 2 to unload the wafer. After unloading, it swings to the inside while the movable door 4 is closed, and the second polishing operation will be performed.

To facilitate those skilled in the art to implement the present invention, the following two embodiments are now provided.

Figure 10:
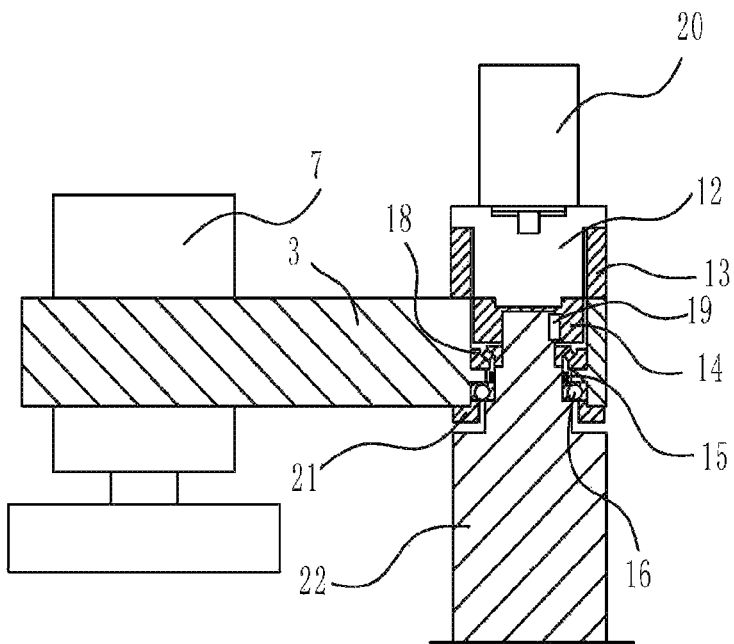
FIG. 10 is a schematic half-sectional view of the structure of the polishing swing arm of Embodiment 1.

Embodiment 1: As shown in FIG. 9 and FIG. 10, the driving mechanism of polishing swing arm 3 is positioned above the polishing platform 9. For the driving mechanism, the rotor of motor 20 is connected to the decelerating mechanism 12, and the stator of motor 20 is connected to the cover of the decelerating mechanism 12. The cover of the decelerating mechanism 12 is connected to the polishing swing arm 3 through the decelerating mechanism flange 13. On side of the polishing swing arm 3 is equipped with a polishing head 7, and the other side contains a top bearing 18 at the upper end and a lower bearing 16 at the lower end to ensure the rotation accuracy of swing arm 3. The inner and outer ring of top bearing 18 are connected to the fixed shaft 22 and the polishing swing arm 3 through its own flange screw hole. The axial movement of lower bearing 16 is prevented by the inner ring nut 15 of bearing and the shaft shoulder of polishing swing arm 3. The rotor of motor 20 is connected to the decelerating mechanism 12, and the output shaft of decelerating mechanism 12 is connected to the fixed shaft 22 through a coupler 14.

During operation, the rotor of motor 20 rotates and is output through the decelerating mechanism 12. The output shaft of the decelerating mechanism 12 is connected to the coupler 14, and the coupler 14 and the fixed shaft 4 are connected by a key 19. Since the fixed shaft 4 cannot rotate, the output shaft of the decelerating mechanism 12 and the rotor of motor 20 are also fixed and unable to rotate. However, since the cover of decelerating mechanism 12 is not fixed, the transmission relationship is that the cover of motor 20 would, along with the cover of the decelerating mechanism 12, rotate together with the polishing swing arm 3, so as to swing during wafer polishing and to position the wafer during wafer loading and unloading. All operations are performed inside the cover of the planarization unit 5, and the wafer transfer station 2 can load and unload wafers with external mechanism at any time without affecting the operation of the internal polishing mechanism.

Figure 11:
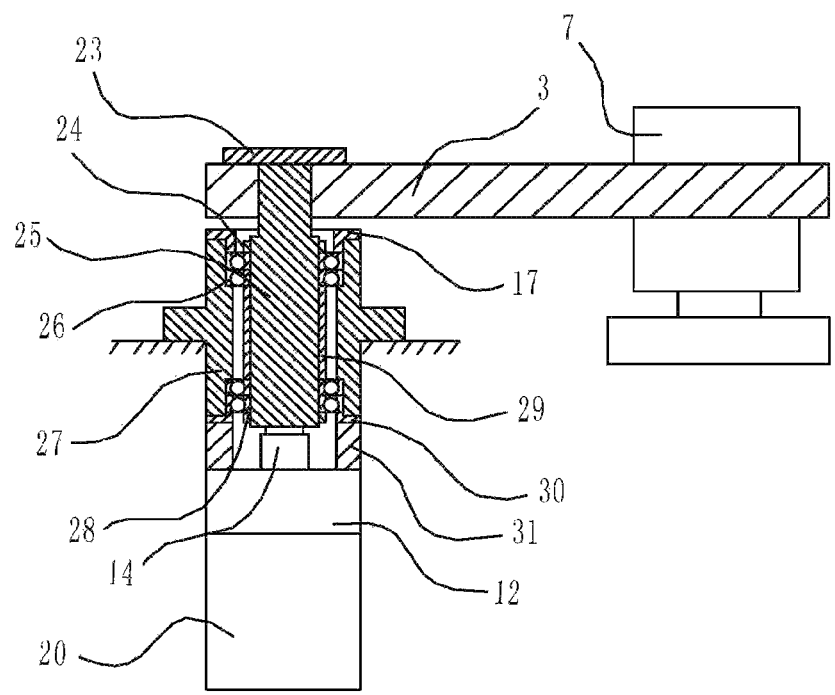
FIG. 11 is a schematic half-sectional view of the structure of the polishing swing arm of Embodiment 2.

Embodiment 2: As shown in FIG. 9 and FIG. 11, the drive mechanism of polishing swing arm 3 is placed under the polishing platform 9. The connection relationship of the drive mechanism is as follows: the cover of the motor 20 is connected to the cover of decelerating mechanism 12 with screws, the rotation shaft of motor 20 is transmitted to the decelerating mechanism 12, which is installed onto the lower end surface of the transmission shaft cover 27 through decelerating mechanism flange 31.

During operation, the rotor of motor 20 is connected to the output shaft of the decelerating mechanism 12, and the stator of motor 20 is connected to the cover of decelerating mechanism 12. The torque of motor 20 is output through the output shaft of decelerating mechanism 12, and then transmitted to the transmission shaft 25 through the coupler 14. The transmission shaft 25 are radially and axially fixed by two sets of bearings 26, and the movement between the two sets of bearings 26 is prevented by the bearing spacer 29, the vertical movement of inner rings of the two sets of bearings 26 is respectively prevented by the upper pair of bearing lock nuts 24 and the lower pair of bearing lock nuts 28, and the outward movement of outer rings of the two sets of bearings 26 is prevented by the upper bearing gland 17 and the lower bearing gland 30. Transmission shaft 25 transmits the torque to the polishing swing arm 3 through the swing arm gland 23, so as to swing the wafer on the platen 11 and position the wafer when the wafer is loaded and unloaded. All operations are performed inside the cover of the planarization unit 5, and the wafer transfer station 2 can load and unload wafers with external mechanism at any time without affecting the operation of internal polishing mechanism.

The invention provides a CMP equipment unit (chemical mechanical planarization unit) that can be operated individually and that can be operated in clusters. The unit contains independent functional structure and processing area, which can ensure the stability of the process. Moreover, the unit is provided with modular design so that customers may order the number of units depending on the needs and freely define the number of CMP groups to meet different processing requirements.

The detailed description of the preferred embodiments is not intended to limit the present invention. The modification, equivalent replacement, improvement, etc. made within the spirit and principle of the invention should be included in the protection scope of the invention.

What is claimed is:

1. A chemical-mechanical planarization equipment, comprising a polishing module, cleaning modules, polishing transfer stations and a wafer transfer module, wherein the cleaning modules are used for cleaning polished wafers, characterized in that, the polishing module includes two rows of polishing unit arrays, each containing two or more sets of polishing units; wherein polishing transfer stations correspond to the two rows of polishing unit arrays and are longitudinally arranged in a row direction of the polishing unit arrays; the cleaning modules are arranged in two rows, corresponding to the two rows of polishing unit arrays; a working area of the wafer transfer module, is located vertically above the polishing transfer stations that are longitudinally arranged, and performs wafer transfer among a loading/unloading area and the polishing transfer stations, and the working area is between the polishing transfer stations, wherein, the wafer transfer module includes a first wafer transfer unit and a second wafer transfer unit, the first wafer transfer unit and the second wafer transfer unit share a guide device, each of the first wafer transfer unit and the second wafer transfer unit comprises a horizontal actuator, a vertical drive, a wafer chuck, and a wafer clamp; the horizontal actuator drives the vertical drive to slide along the guide device horizontally; the vertical drive connected with the wafer chuck, and controls the wafer chuck to work in two modes of a high position and a low position; the wafer clamp is installed on the wafer chuck, and performs opening and closing actions, and wherein the guide device extends along a first direction, and includes a first region, a middle area and a second region connected in sequence along the first direction, wherein the middle area is sandwiched in between the first region and the second region;

wherein the horizontal actuator of the first wafer transfer unit extends along the first direction on a first side of the guide device, and is arranged in parallel with the first region and the middle area of the guide device, and terminates in the middle area, and the horizontal actuator of the second wafer transfer unit extends along the first direction on a second side of the guide device, and is arranged in parallel with the second region and the middle area of the guide device, and terminates in the middle area, and the horizontal actuator of the first wafer transfer unit and the horizontal actuator of the second wafer transfer unit has a movable overlap only at the middle area of the guide device along the first direction.

2. The chemical-mechanical planarization equipment of claim 1, wherein the loading and unloading area is a cleaning transfer station where wafers entering and leaving the polishing module are temporarily stored.

3. The chemical-mechanical planarization equipment of claim 1, wherein each of the first wafer transfer unit and the second wafer transfer unit are arranged along the row direction of the two rows of polishing units as a cascade, and performs wafer transfer among loading/unloading area and the polishing transfer stations, and between the polishing transfer stations; the first wafer transfer unit and the second wafer transfer unit collaborate with each other to circulate wafers in the entire polishing unit arrays.

4. The chemical-mechanical planarization equipment of claim 1, wherein the wafer chuck is a flip structure where two sets of wafer clamp mechanisms are allocated on both sides of the wafer chuck.

5. The chemical-mechanical planarization equipment of claim 1, wherein the polishing transfer stations move longitudinally in the row direction of the polishing unit arrays, and one of the polishing transfer stations corresponding to more than one of the polishing units.

6. The chemical-mechanical planarization equipment of claim 1, wherein a polishing door that is configured to be opened and closed is allocated between the polishing units and the polishing transfer stations.

7. A wafer transfer method using the chemical-mechanical planarization equipment of claim 1, comprising steps of:

in an initial state in the first wafer transfer unit, the wafer chuck controlled by the vertical drive of the first wafer transfer unit is at the high position, so that the wafer chuck of the first wafer transfer unit can freely move horizontally;

when the horizontal actuator of the first wafer transfer unit drives the vertical drive of the first wafer transfer unit to move along the guide device to a location above a cleaning transfer station or the polishing transfer stations, the vertical drive of the first wafer transfer unit controls the wafer chuck of the first wafer transfer unit to drop down to the low position, and the wafer clamp of the first wafer transfer unit installed on the wafer chuck of the first wafer transfer unit grabs a wafer;

thereafter, the vertical drive of the first wafer transfer unit controls the wafer chuck of the first wafer transfer unit to rise to the high position, and the horizontal actuator of the first wafer transfer unit drives the vertical drive of the first wafer transfer unit to move along the guide device to the location above a next cleaning transfer station or the polishing transfer stations;

the vertical drive of the first wafer transfer unit controls the wafer chuck of the first wafer transfer unit to drop down to the low position, and the wafer clamp on the wafer chuck of the first wafer transfer unit releases the wafer;

repeat the above steps so that the wafer can be transferred among the cleaning transfer station and the polishing transfer stations.

* * * * *